(12) United States Patent
Lee et al.

(10) Patent No.: US 6,323,523 B1
(45) Date of Patent: Nov. 27, 2001

(54) N-TYPE STRUCTURE FOR N-TYPE PULL-UP AND DOWN I/O PROTECTION CIRCUIT

(75) Inventors: Jian-Hsing Lee, Pu Tzu; Yi-Hsun Wu, Taipei; Shui-Hung Chen, Hsinchu; Jiaw-Ren Shih, Tou Liu, all of (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 09/494,682

(22) Filed: Jan. 31, 2000

(51) Int. Cl.[7] .................. H01L 23/62; H01L 29/00; H01L 31/00; H01L 31/062; H01L 31/113
(52) U.S. Cl. .................. 257/355; 257/356; 257/357; 257/409; 257/452; 257/500; 257/501
(58) Field of Search .................. 257/355, 339, 257/372, 409, 452, 484, 500, 501, 356, 357

(56) References Cited

U.S. PATENT DOCUMENTS 5,491,358 * 2/1996 Miyata .................. 257/546
6,049,111 * 4/2000 Higuchi et al. .................. 257/355

* cited by examiner

*Primary Examiner*—Jerome Jackson, Jr.
*Assistant Examiner*—Jesse A Fenty
(74) *Attorney, Agent, or Firm*—Baker Botts LLP

(57) ABSTRACT

An ESD protective circuit formed by n-type pull-up transistors and n-type pull-down transistors on a p-type silicon substrate for protecting an internal device circuit is disclosed. In the circuit, a n-well region having a p+ diffusion and a n+ diffusion therein being formed adjacent one drain region of one pull-up transistors, the p+ diffusion and a n+ diffusion, as well as all the drain regions of the pull-up transistors are coupled to a power supply. All the source regions of the pull-up transistors and drain regions of the pull-down transistors are connected to an I/O pad. All the source regions of the pull-down transistors including the p+ guardings are grounded. The gates of all transistors are connected to the internal device circuit so that the internal device circuit will be immunity from the ESD.

12 Claims, 6 Drawing Sheets

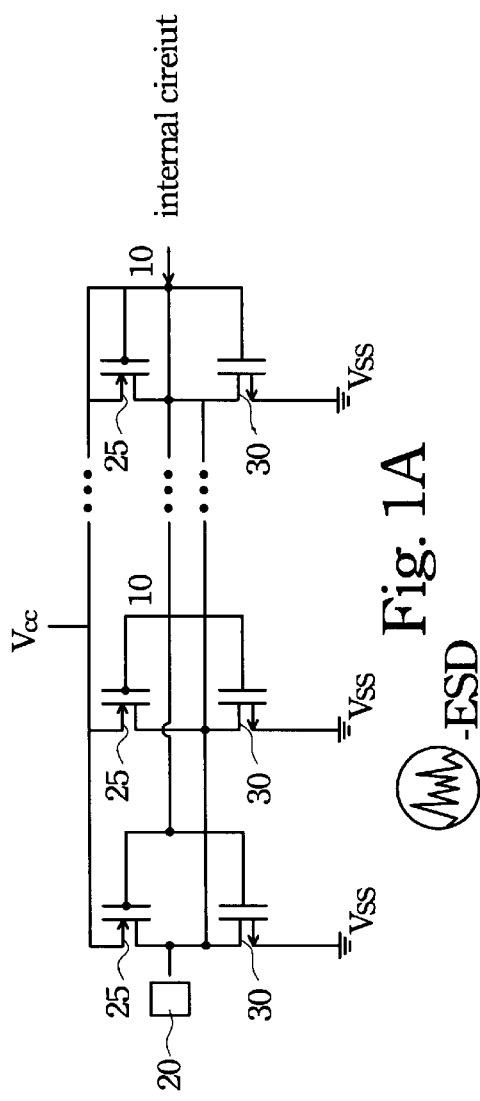
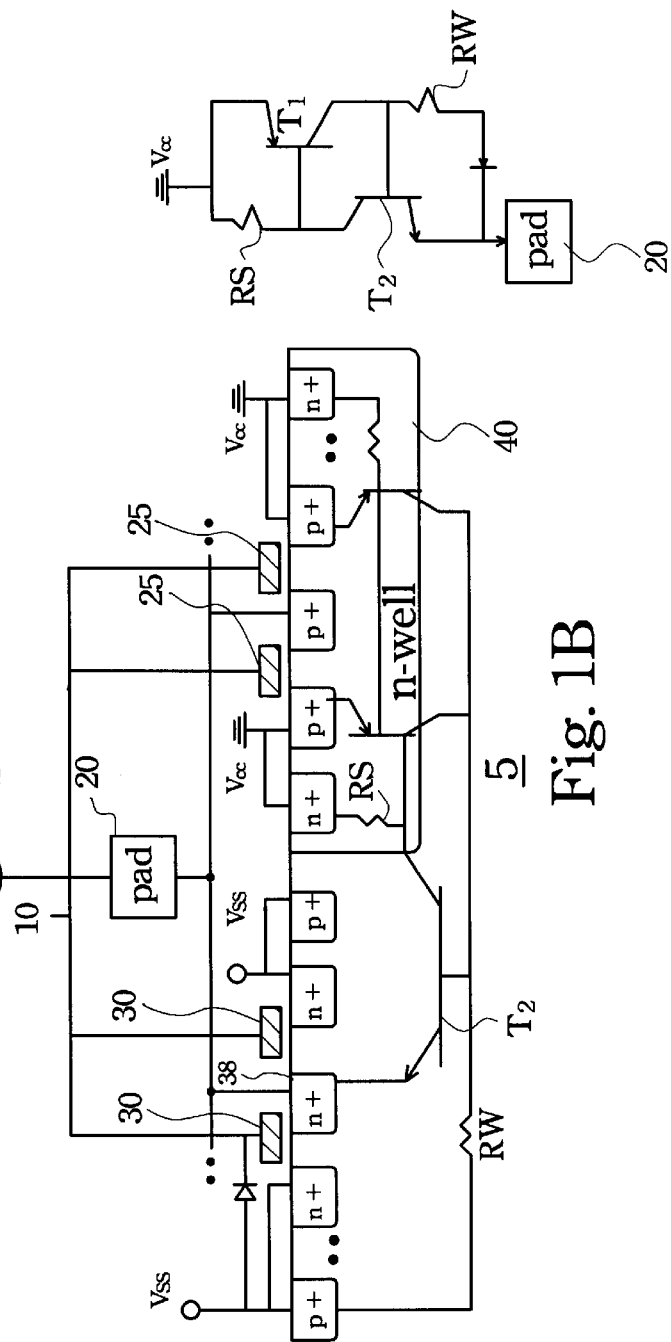
Fig. 1A
Fig. 1B

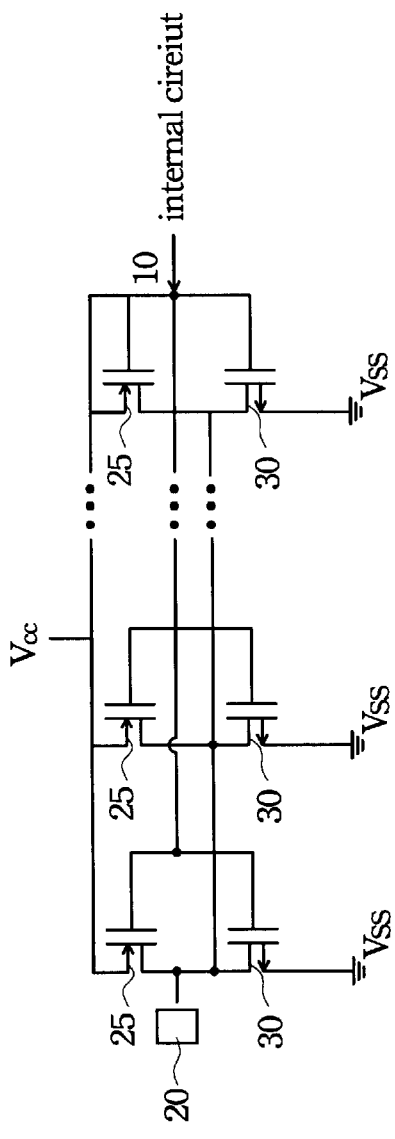
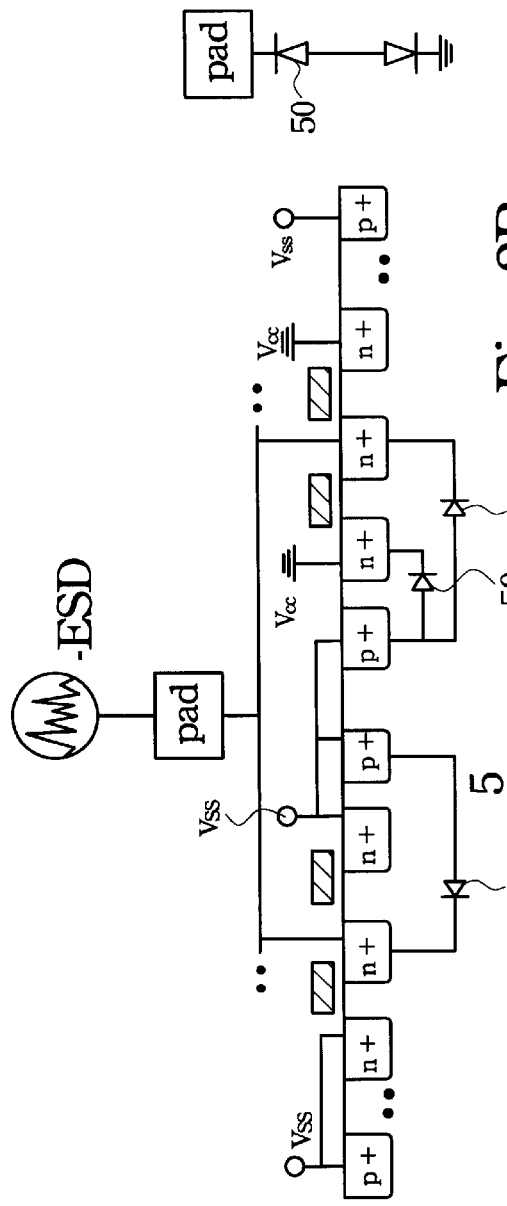
Fig. 2A
Fig. 2B

N-TYPE STRUCTURE FOR N-TYPE PULL-UP AND DOWN I/O PROTECTION CIRCUIT

BACKGROUND OF THE INVENTION

1. Field of the Invention

The present invention relates to ESD protection circuits for semiconductor devices and, more particularly, to an ESD protection circuit connects between I/O pad and an I/O of the internal device circuit.

2. Description of the Prior Art

With the advent of the ULSI era in 1990s, the technique of the integrate circuit, become rapidly prompt. The most prominent features are the continued scaled down the device-feature size so as to increase multiple functions in a chip without extra increase the chip's dimension. Moreover, in either the decrease of the power consumption or the increase the product portability is even significantly prompt with the alternative of the generations. For example, the voltage level VCC in typical 0.35 $\mu$m CMOS technique with the gate oxide of about 7 nm has been scaled down to 3.3V or below, but the voltage level for the IC's with the gate oxide thickness of about 14 nm is about 5V.

However, as a device scaled from one micron down to submicron or beyond, it may suffer more stringent problems. For examples, hot carriers effect, and punchthrough effects are two of the major constraints in CMOS transistor scaling. Further, parasitic resistance and capacitance in the scaled device structure are required to avoid. Another worth to most take care one is the electric static discharge problems.

As mentioned before, the gate oxide thickness of the MOS devices is decreased with the advance of the IC's technique. This decrease, relative to breakdown voltage, has resulted in the greater susceptibility for these devices come to damage from the excessive voltages such as caused by an electrostatic discharge (ESD) event. During an ESD event, charges are transferred from one or more pins of the integrated circuits into devices in a very short duration, typically less than one microsecond. The transfer charges generates voltages that are large enough to break down insulating films, e.g., gate oxides on MOSFET devices, or that can dissipate sufficient energy to cause thermal failures in the devices. Consequently, in order to deal with transient ESD pulses, an integrated circuit must incorporate protection circuits at every I/O pin.

FIG. 1A shows a conventional ESD protective circuit. It has an input terminal 10 and an output terminal 20 thereto connection internal circuits and an I/O pad 20, respectively. The ESD protective circuit includes a plurality of PMOS transistors 25 in a n-well and a plurality of NMOS transistor in a p-substrate. The PMOS transistors 25 having source terminals thereof connect to a power supply VCC, drain terminals thereof connect to the I/O pad. The NMOS transistors having drain terminals thereof connect to the I/O pad 20, and the source terminals thereof connect to ground. All the gates are connected to an input terminal 10 thereto connect the internal circuit.

To prevent a negative ESD stress pulse event, the ESD protective test is achieved by setting the contact regions, which is originally connected to VCC, to the ground. The test I/O pad 20 is received a negative ESD pulse, else pins (or I/O pad) of the IC chip to be floated include the VSS, as is shown in the FIG. 1B. In the figure, shows an equivalent circuit too. It shows a parasitic SCR structure formed when the cathode 38 is received a negative ESD stress pulse. The trigger voltage of the SCR is determined by the avalanche breakdown voltage level of the n-well to p-substrate 5. When the n-well 40 to p-substrate 5 breakdown, the generated hole injected into the p-substrate 5 cause the p-substrate voltage to increase. It is then forward biasing the emitter junction, and cause npn transistor T2 to turn on, The operation voltage then goes low to about 1.2 V to sustain a high current to remove excess charge through the SCR circuit so that the device of the internal circuit will not be damaged.

However, above PMOS FET and NMOS FET formed ESD protection circuit has some issues. For example, as more circuits and functions are integrated into a single chip, a chip may contain different power pins to supply the currents for circuit operation. The voltage levels may be VCC or VDD for different IC's. The different voltage supply levels may pull another IC to the same voltage level if the ESD protection circuit used is the form as aforementioned PMOS FET and NMOS FET ESD circuit. A forward bias p-n diode may be generated from the pad which receives a high voltage to the source terminal of the PMOS so that it pull up the voltage of the devices which is original supplied with lower voltage.

For avoiding such situation to occur, using NMOS transistors to replace the PMOS as pull-up transistor is proposed. Please refer to FIG. 2A. The ESD device can protect a positive ESD stress pulse versus VSS, denoted as +ESD/VSS, a positive ESD stress pulse versus VCC, denoted as +ESD/VCC, and a negative ESD stress pulse versus VSS, denoted as –ESD/VSS except a negative ESD stress pulse versus VCC. For illustrating such situation, a schematic cross-sectional layout for the parasitic circuit is shown in FIG. 2B. There are diodes with their p regions back in back fashion series connected. Thus for relieving the ESD stress pulse, high dissipation heat will be generated in p-substrate, as a result, the sensitive devices damage will occur, It is therefore an object of the present invention to provide an ESD protection so as to improve aforementioned issues.

SUMMARY OF THE INVENTION

An ESD protective circuit formed by n-type pull-up transistors and n-type pull-down transistors on a p-type silicon substrate for protecting an internal device circuit is disclosed. In the circuit, a n-well region having a p+ diffusion and a n+ diffusion therein being formed adjacent one drain region of one pull-up transistors, the p+ diffusion and a n+ diffusion, as well as all the drain regions of the pull-up transistors are coupled to a power supply. All the source regions of the pull-up transistors and drain regions of the pull-don transistors are connected to an I/O pad. All the source regions of the pull-down transistors including the p+ guardings are grounded. The gates of all transistors are connected to the internal device circuit so that the internal device circuit will be immunity from the ESD.

The proposed ESD circuit can relief the negative ESD stress pulse versus VCC by triggering a parasitic SCR circuit. The present invention is thus solve forgoing prior art issues.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A and FIG. 1B are schematic cross-sectional layout and equivalent ESD circuit having PMOS transistor and NMOS transistor as pull-up and pull-down transistors in accordance with the prior art.

FIG. 2A and FIG. 2B are schematic cross-sectional layout and equivalent ESD circuit having NMOS transistors as pull-up and pull-down transistors in accordance with the prior art.

DESCRIPTION OF THE PREFERRED EMBODIMENT

As depicted in the foregoing background of the invention, the issues occurred in the conventional ESD protective devices including either can't use in circuitry which has different voltage supplies (e.g. using cascaded PMOS and NMOS FETs as an ESD protect circuit) or protective failure (e.g. used NMOS FETs as pull-up and pull-down transistors) while suffering from a negative ESD event.

Figure 3A:
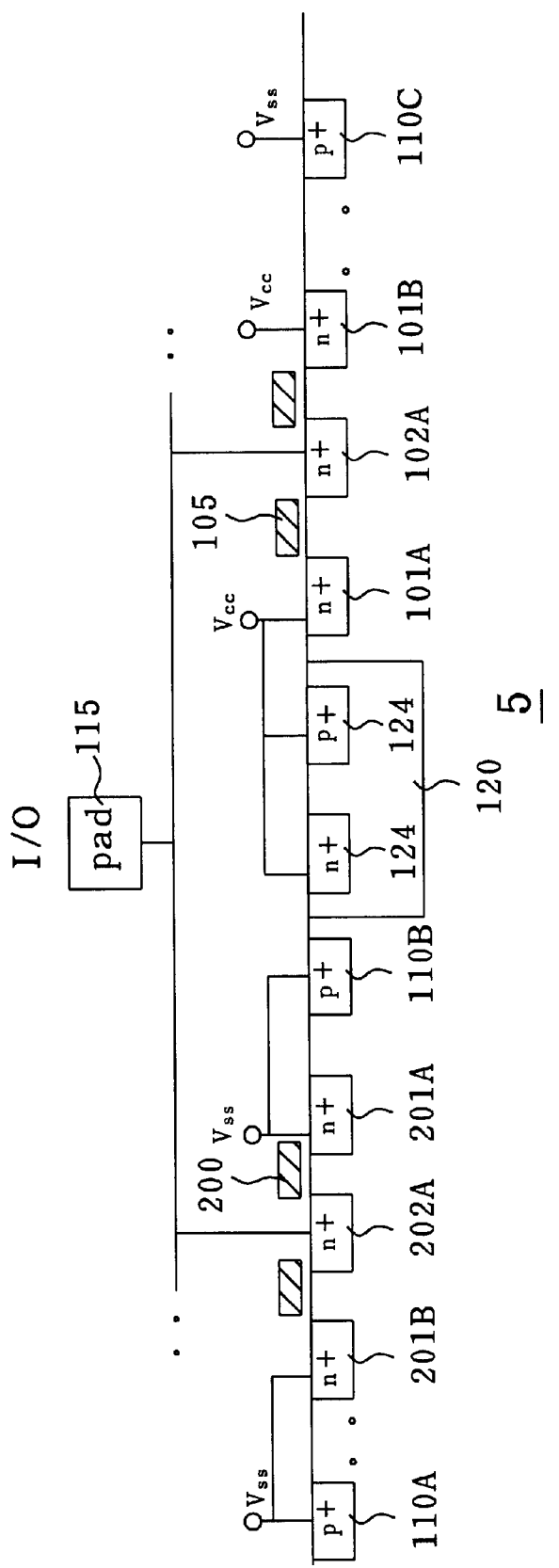
FIG. 3A and FIG. 3B are a schematic cross-sectional layout and equivalent ESD circuit having NMOS transistors as pull-up and pull-down transistors in accordance with the present invention.

For improving ESD immunity, particularly for negative ESD pulse events, a novel ESD device circuit scheme is provided and shown in FIG. 3A. In the figure, a plurality of NMOS transistors formed thereon a p-type substrate 5, wherein at east one NMOS transistor 105 acts as pull-up transistor and at least one NMOS transistor 200 acts as pull-down transistors. The drain regions 101A, 101B, . . . , of the pull-up transistors are connected to VCC. The source regions 201A, 201B, . . . , of the pull-down transistors are connected to VSS. All the source regions 102A, . . . , of the pull-up transistors and all the drain regions 202A, . . . , of the pull-down transistors are connected together to an I/O pad 115. In addition, two of three p+ guardrings 110A, 110B, are around the border of the pull-down transistors, and remaining one, p+ guardring110C is at the border of pull-up transistor away from the pull-down transistors to reduce the bulk resistance of the p+ substrate 5 as in the prior art. The different from the prior art is an n-well 120 formed therein with a n+ diffusion 122 and a p+ diffusion 124 adjacent the drain region 101A of the pull-up transistor 105. Both of the n+ diffusion 122 and the p+ diffusion 124 is through a bus or a contact connected to VCC.

Figure 3B:
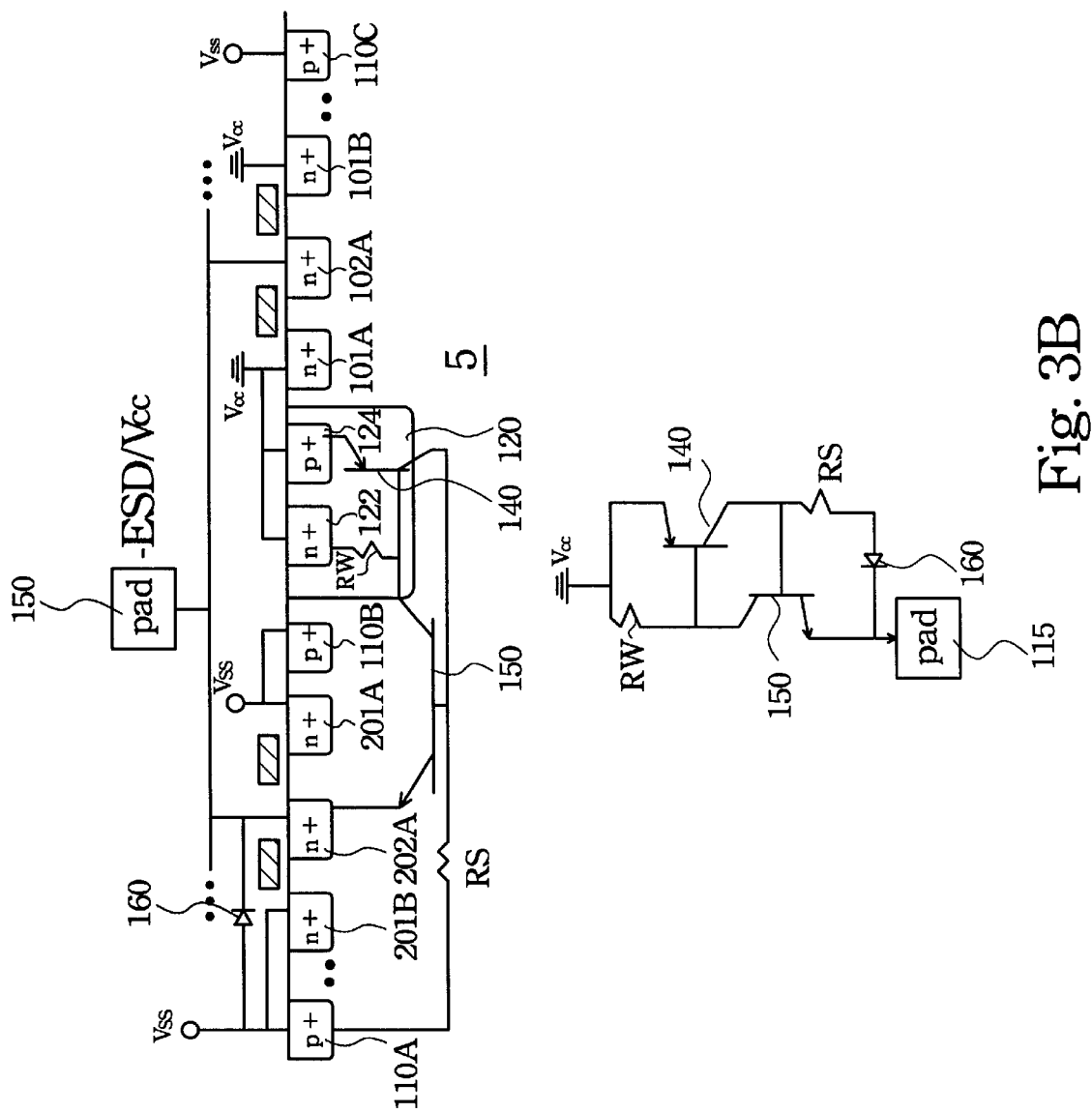

For making negative ESD /VCC test, all the VCC terminal are connected to a ground voltage, and the VSS is set to float, as is shown in FIG. 3B. The test I/O pad 115 is received a negative ESD pulse, as a consequence, a parasitic SCR circuit 100 is generated. The SCR 100 composed of a first pnp parasitic transistor 140 and a second npn parasitic transistor 150 as well as a parasitic diode 160 that are interconnected so that an emitter-collector current of one transistor is a base current of the other transistor.

The first pnp transistor 140 is formed by the anode, a p+ diffusion 124 in the n-well 120, as emitter, the n-well 120 as base, and the p-substrate as collector. The second npn is formed by the cathode, a n+ diffusion 202 in the p-substrate 5, as an emitter, the p-substrate 5 as a base and the n-well 120 as a collector. In addition, the resistance Rw and Rs are formed by the n-well 120 and the p-substrate 5, respectively. The diode 160 is formed by the n+ diffusion 202A and the p+ diffusion 110A.

In order to make the parasitic SCR a good ESD protection, the trigger voltage must be lower than the breakdown voltage of gate oxide of the NMOS transistor in the internal circuit. In the case, when negative ESD stress is passed into the pad through the cathode, the trigger voltage is determined by the avalanche breakdown voltage of the n-well 120 to the p-substrate 5. The typical value of the breakdown voltage is about 13–18 volt in deep submicron process. When the n-well 120 to p-substrate 5 breakdown, the generated hole injected into the p-substrate 5 cause the p-substrate voltage to increase. It is then forward biasing the emitter junction, and cause npn transistor to turn on, The operation voltage then goes low to about 1.2 V to sustain a high current so that the devices of the internal circuit will not be damaged.

Figure 4:
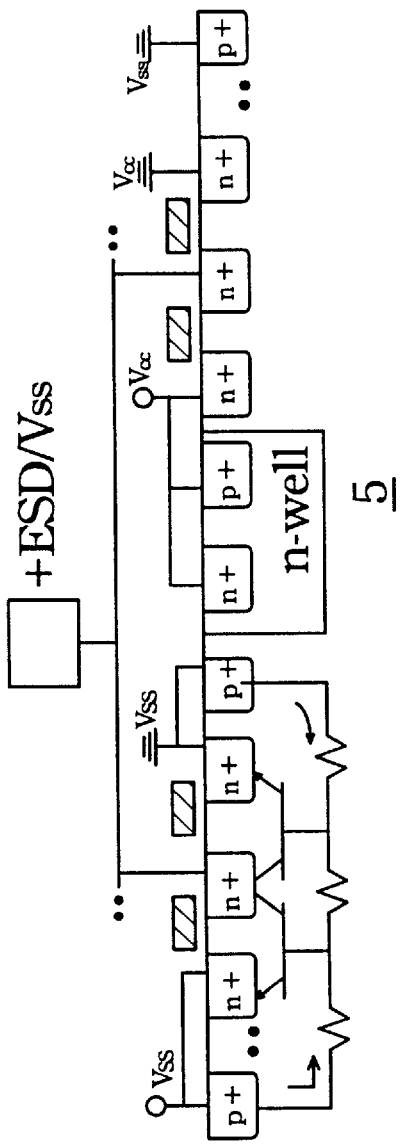
FIG. 4, FIG. 5 and FIG. 6 are a schematic cross-sectional layout while making, respectively, +ESD/VSS, −ESD/VSS and +ESD/VCC tests in accordance with the present invention.
Figure 5:
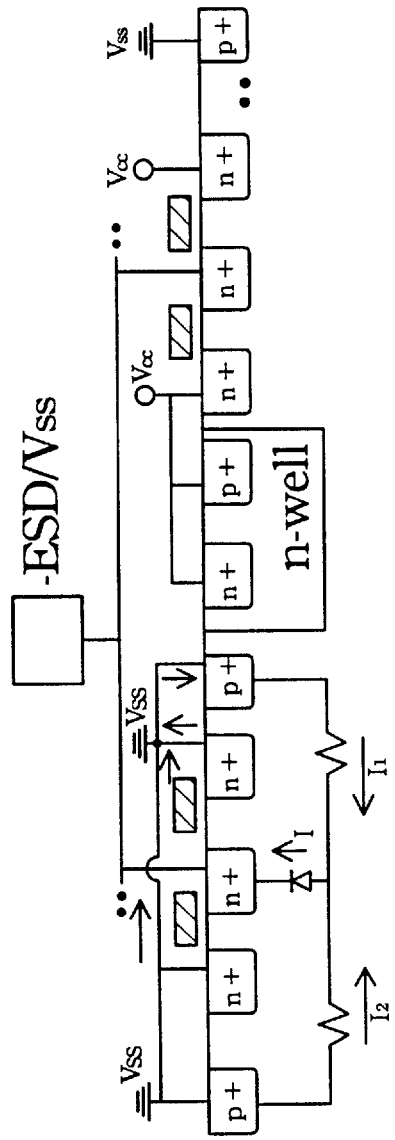
Figure 6:
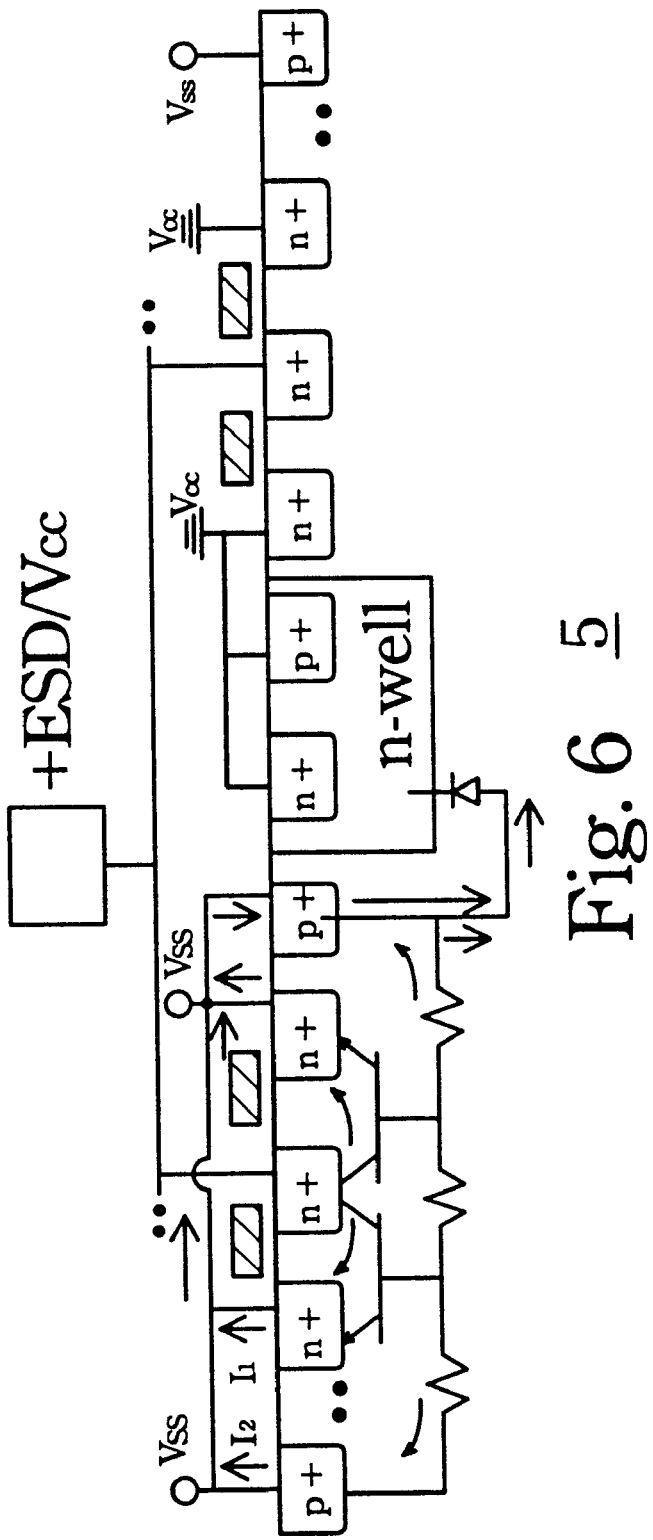

In the cases of +ESD/VSS, +ESD/VSS and −ESD/VCC tests, the relevant parasitic circuitry generated and possible current direction for release the ESD stress so as to alleviate the ESD damage is shown in FIG. 4, FIG. 5 and FIG. 6., respectively, which have the same performance as in the prior art. Thus it will not give in detailed.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An ESD protective circuit formed on a p-type silicon substrate structure for protecting an internal device circuit comprising:

a n-type pull-up transistor having a first drain region, a first source region and a first gate, said first drain region connected to a power terminal;

a n-well region formed in said p-type silicon substrate, and being adjacent said first drain region, and having a n-type region and a p-type region therein, both of them being connected to said power terminal;

a n-type pull-down transistor having a second source region, a second drain region and a second gate, said second source region connected to a voltage ground terminal, said second gate and said first gate being coupled to an I/O terminal of said internal device circuit, said first source region and said second drain region connected to an I/O pad; and a p+ guardring around said pull down transistor connected to said voltage ground terminal.

2. The ESD protective circuit according to claim 1, wherein said p-type region and said n-type region are heavier doped than that of said n-well.

3. The ESD protective circuit according to claim 1, further comprises a p-type doped region formed in said p-type silicon substrate, and being adjacent said first source region of said pull up transistor connected to said voltage ground terminal.

4. The ESD protective circuit according to claim 1, further comprises a parasitic SCR circuit while receiving an negative ESD pulse from said I/O pad, and said power terminal coupled to a voltage ground as well as said voltage ground terminal being floated, said parasitic SCR circuit comprising:

a pnp transistor having said p-type region in said n-well as a first emitter, said n-well as a first base and said p-substrate as a first collector;

a npn transistor having said second drain region as a second emitter, said p-substrate as a second base and said n-well as a second collector;

a first resistance formed by said n-well connected between said n-type region and said first base;

a second resistance formed by said p-substrate connected between said p+ guardring; and a diode formed by said p+ guardring and said second drain region.

5. An ESD protective circuit formed on a p-type silicon substrate structure for protecting an internal device circuit comprising:

a plurality of n-type pull-up transistors, each respective having a first drain region, a first source region and a first gate, all of said first drain region connected to a power terminal;

a n-well region formed in said p-type silicon substrate, and being adjacent one of said first drain region, and having a n-type region and a p-type region therein, and both of them connected to said power terminal;

a plurality of n-type pull-up transistors, each having a second source region, a second drain region and a second gate, all of said second source region connected to a voltage ground level, each of said second gate and said first gate being coupled to an I/O terminal of said internal device circuit, each of said first source region and said second drain region connected to an I/O pad; and a p+ guardring around a border of said plurality pull down transistors connected to said voltage ground level.

6. The ESD protective circuit according to claim 5, wherein said p-type region and said n-type region are heavier doped than that of said n-well.

7. The ESD protective circuit according to claim 5, further comprises a p-type doped region formed in said p-type silicon substrate, and being adjacent one of said first source region of said plurality of pull up transistors and being connected to said voltage ground level.

8. The ESD protective circuit according to claim 5, further comprises a parasitic SCR circuit while receiving an negative ESD pulse from said I/O pad, and said power terminal coupled to a voltage ground as well as said voltage ground terminal being floated, said parasitic SCR circuit comprising:

a pnp transistor having said p-type region in said n-well as a first emitter, said n-well as a first base and said p-substrate as a first collector;

a npn transistor having one of said second drain region as a second emitter, said p-substrate as a second base and said n-well as a second collector;

a first resistance formed by said n-well connected between said n-type region and said first base;

a second resistance formed by said p-substrate connected between said p+ guardring; and a diode formed by said p+ guardring and said second drain region.

9. An ESD protective circuit formed on a p-type silicon substrate structure for protecting an internal device circuit comprising:

a plurality of n-type pull-up transistors, each n-type pull-up transistor having a first drain region, a first source region and a first gate, and all of said n-type pull-up transistors being in a series order adjacent so that each two adjacent transistors having either a common source region or a common drain region, and further all of said first drain region connected to a power terminal;

a n-well region formed in said p-type silicon substrate, and being adjacent one of said first drain region, and having a n-type region and a p-type region therein, and both of them connected to said power terminal;

a plurality of n-type pull-up transistors, each having a second source region, a second drain region and a second gate, and all of said n-type pull-down transistors being in a series order adjacent so that each two adjacent transistors having either a common source region or a common drain region, and further all of said second source regions connected to a voltage ground level, each of said second gate and said first gate being coupled to an I/O terminal of said internal device circuit, each of said first source region and said second drain region connected to an I/O pad; and a p+ guardring around said plurality pull down transistors connected to said voltage ground level.

10. The ESD protective circuit according to claim 9, further comprises wherein said p-type region and said n-type region are heavier doped than that of said n-well.

11. The ESD protective circuit according to claim 9, further comprises a p-type doped region formed in said p-type silicon substrate, and being adjacent a border of said first source region of said plurality of pull up transistors and being connected to said voltage ground level.

12. The ESD protective circuit according to claim 9, further comprises a parasitic SCR circuit while receiving an negative ESD pulse from said I/O pad, and said power terminal coupled to a voltage ground as well as said voltage ground terminal being floated, said parasitic SCR circuit comprising:

a pnp transistor having said p-type region in said n-well as a first emitter, said n-well as a first base and said p-substrate as a first collector;

a npn transistor having one of said second drain region as a second emitter, said p-substrate as a second base and said n-well as a second collector;

a first resistance formed by said n-well connected between said n-type region and said first base;

a second resistance formed by said p-substrate connected between said p+ guardring; and a diode formed by said p+ guardring and said second drain region.

* * * * *